United States Patent [19]
Sigsbee et al.

[11] 3,946,418
[45] Mar. 23, 1976

[54] RESISTIVE GATE FIELD EFFECT TRANSISTOR

[75] Inventors: Raymond A. Sigsbee, Schenectady; William D. Barber, Elnora, both of N.Y.

[73] Assignee: General Electric Company, Schenectady, N.Y.

[22] Filed: Nov. 1, 1972

[21] Appl. No.: 302,799

[52] U.S. Cl. .................... 357/23; 357/22; 357/24; 357/53; 357/86; 307/304
[51] Int. Cl.² ........................................ H01L 29/78
[58] Field of Search ........ 317/235 A, 235 B, 235 C, 317/235 AH, 235 AE; 307/304

[56] References Cited
UNITED STATES PATENTS

| 3,192,398 | 6/1965 | Benedict | 317/235 |
|---|---|---|---|
| 3,708,731 | 1/1973 | McDonald | 317/235 |
| 3,728,590 | 4/1973 | Kim et al. | 317/235 |

FOREIGN PATENTS OR APPLICATIONS

| 30,359 | 12/1969 | Japan | 317/235 |
|---|---|---|---|
| 300,472 | 4/1968 | Sweden | 317/235 |

*Primary Examiner*—Andrew J. James
*Attorney, Agent, or Firm*—Daniel R. Levinson; Joseph T. Cohen; Jerome C. Squillaro

[57] ABSTRACT

A resistive gate field effect transistor (FET) is disclosed in which the gate comprises a resistive film overlying an insulating layer and in contact with both the source and drain electrodes. This provides an integrated circuit, bidirectional voltage limiter in which the limiting voltage can be tailored to almost any value likely to be found on an integrated circuit. In another form of the present invention, a conductive gate is added between the resistive gate and the substrate.

12 Claims, 3 Drawing Figures

RESISTIVE GATE FIELD EFFECT TRANSISTOR

This invention relates, structurally, to field effect transistors, in particular to field effect transistors having resistive gates, and, functionally, to load devices or voltage limiting devices, in particular to a load or voltage limiting device having bidirectional characteristics.

In the prior art, a number of voltage limiting devices, or constant voltage loads, are well known; for example, voltage regulator tubes and zener diodes. These are all discrete devices, however. In integrated circuits, it is a recurring problem to find a suitable, integrated voltage regulating element. Prior art attempts at solving this problem have generally involved a large number of compromises. For example, the emitter-base diode of a bipolar transistor has been used to obtain a zener diode. However, processing and semiconductor doping restrictions have largely prevented any variation in the limiting voltage, generally about 5 volts. Thus, the voltage obtainable is limited by and dependent on the other devices on the chip.

Another problem with voltage limiters of the prior art is that they are generally unidirectional. For example, a zener diode exhibits voltage limiting effects only in the reverse biased condition. Forward biased, it conducts much like any other diode. A number of circuits exist, however, that require bidirectional voltage limiting, for example operational amplifiers. In the prior art, series connected, oppositely poled zener diodes have been used to provide a bidirectional voltage limiting capability. However, for integrated circuits, this approach becomes difficult to implement. Further, as noted above, the range of limiting voltage is rather narrow.

In view of the foregoing, it is therefore an object of the present invention to provide an integrated circuit, constant voltage load.

It is a further object of the present invention to provide a voltage limiter that is formed on the same chip as other elements, but whose limiting voltage is independent of other elements.

Another object of the present invention is to provide a constant voltage load having bidirectional voltage limiting characteristics.

A further object of the present invention is to provide a constant voltage load having a bidirectional, asymmetrical voltage limiting characteristic.

The foregoing objects are achieved in the present invention wherein a field effect transistor comprises source and drain electrodes, and a resistive layer as a gate electrode in contact with both the source and the drain. The channel resistance of the transistor is thus in parallel with the resistance of the film. When a voltage is applied, the resistance of the film predominantly controls current flow until the applied voltage exceeds the turn on voltage of the transistor, whereupon the channel resistance abruptly decreases and predominately controls current flow. At this point, the current vs. voltage characteristic curve of the transistor becomes highly non-linear and the transistor acts to limit the voltage drop across itself.

In an alternative embodiment, a conductive gate is combined with the resistance gate, which acts as a potentiometer. The approximately uniform field applied by the conductive gate provides a softer turn-on characteristic.

As used herein, the term "constant voltage load" is intended to mean those devices exhibiting a substantially constant voltage drop that is independent of current over a portion of the operating range of the device, whether the device is used as a voltage limiter, a constant voltage load, or as a coupling element exhibiting a fixed voltage drop.

A more complete understanding of the present invention can be obtained by considering the following detailed description in conjunction with the accompanying drawings, in which.

Figure 1:
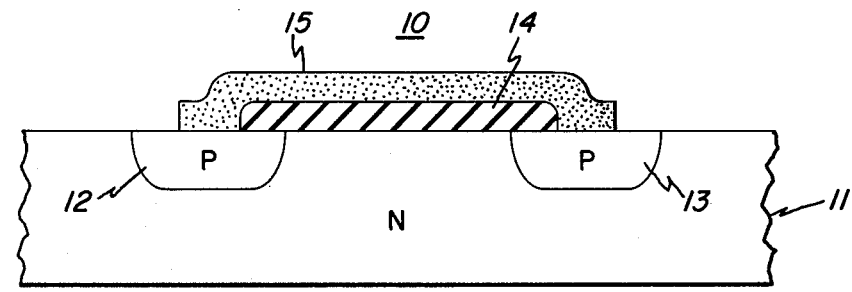
FIG. 1 illustrates a preferred embodiment of the present invention.

FIG. 1 illustrates a preferred embodiment of the present invention in which a resistive gate field effect transistor 10 comprises semiconductor substrate 11 having source and drain regions 12 and 13, respectively, formed therein. Overlying the region between source 12 and drain 13 is an insulating layer 14 which may conveniently comprise an oxide of the substrate. Overlying insulating layer 14 and in contact with both source 12 and drain 13 is a resistive film 15.

Resistive gate field effect transistor 10 can be fabricated by any suitable means known in the art. For example, source and drain regions 12 and 13 can be formed by diffusion through a mask or by ion implantation. Insulating layer 14 and resistive film 15 may be sputter deposited. Substrate 11 and source and drain regions may conveniently comprise n- and p-type silicon, respectively. As illustrated in FIG. 1, resistive gate field effect transistor 10 comprises a p-channel field effect transistor.

Resistive film 15 should have a high resistance compared to the channel resistance of the field effect transistor. The channel resistance of a turned on field effect transistor is typically on the order of $10^5$ ohms per square. Thus, the resistive film should have a greater resistance, for example $10^6$ ohms per square to approximately $10^9$ ohms per square. It should be understood that these values are relative and that a field effect transistor having a very low channel resistance can be used with a resistive film having a proportionally lower resistance. Suitable resistance films include, for example, polycrystalline silicon, and sputtered conductive glasses such as those containing $V_2O_5$.

Figure 3:
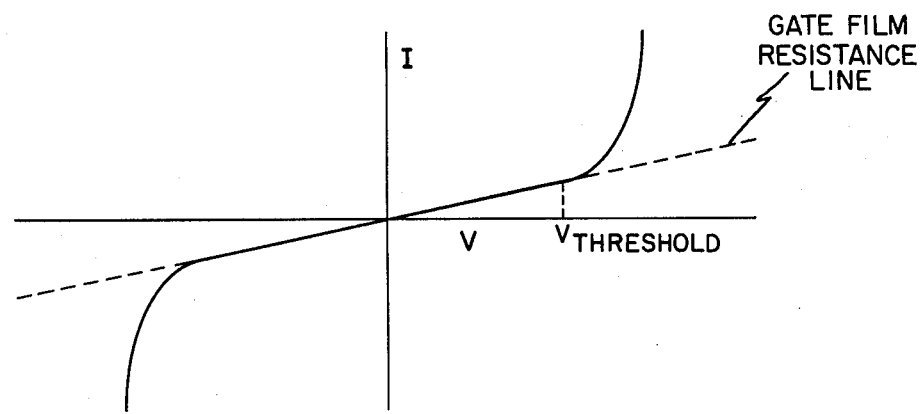
FIG. 3 illustrates the operating characteristic of the present invention.

The operation of resistive gate field effect transistor 10 is illustrated in FIG. 3, which is a plot of the current vs. voltage characteristic for field effect transistor 10. As illustrated in FIG. 3, the dashed line represents the linear resistance presented by a resistive film if no other element were coupled in parallel therewith. However, in parallel with the resistive film is the source-drain resistance of the field effect transistor. When the channel of the field effect transistor is turned on across the source-drain spacing, to within one depletion width of the source region, the source-drain resistance drops sharply. Thus, the current through the channel increases very rapidly and non-linearly. The net result is that field effect transistor 10 attempts to maintain the applied voltage at approximately this turn on voltage.

Specifically, at low drain voltage levels the resistance of the gate film is predominant. As a source-drain voltage is applied the surface nearest to the drain will become enhanced. Although the local gate threshold has been exceeded, channel conductance does not occur because the source end of the channel is still pinched off. As the drain voltage and gate induced field increase, the edge of the region of enhancement moves in the source-drain spacing until it approaches the source. As it does the source-channel voltage gradient increases and channel conduction starts first by space charge limited conductance and finally by channel modulation. Since part of the resistor is not only over the channel but also over the contact this latter effect allows the threshold field to extend over the full channel width. When conduction first appears, it increases much more rapidly than the square of the voltage. The device thus has the characteristics of a voltage limiter.

Since the onset of channel current conduction is controlled by space charge limited conductance from the source to the channel, the turn on voltage for the device can be varied by varying the source-drain distance of the device. For example, a longer source-drain distance will increase the drain voltage necessary before the channel is formed close enough to the source for appreciable source channel current to flow. The space charge limited conductance region can also be altered by biasing the substrate. This is also known as back gate biasing.

It should be noted with respect to field effect transistor 10 that the device is completely symmetrical, that is the designation of region 12 as a source and region 13 as a drain is purely arbitrary. As illustrated in FIG. 3, the voltage limiting action takes place in both conduction directions through field effect transistor 10.

As a specific example of a field effect transistor in accordance with the present invention, a substrate comprising n-type 5 ohm-cm resistivity (1, 0, 0) oriented silicon having p-type resistivity source and drain regions diffused therein to a depth of 1.5 $\mu$M with a metallurgical junction spacing of 32 $\mu$M and an insulating layer of silicon dioxide 1,000 angstroms thick and 35 $\mu$M long covered by a resistive film contacting both the source and the drain and having a resistivity of 1,000 ohm-cm and a thickness of 5,000 angstroms produces an approximate turn-on voltage of 15 volts when the source to substrate bias is 5 volts. It should be understood that the values given above are exemplary only and in no way limiting.

Further, modifications may be made in the embodiment of FIG. 1 without compromising its constant voltage capability. For example, resistive film 15 need not exhibit uniform resistivity along its length from source 12 to drain 13. By suitable doping, for which the process itself is known in the art, the central portion of resistive film 15 can be made more conductive. The effect on the operating characteristics of the device is to move the enhanced region closer to the source for a given applied voltage. When sufficiently near the source, the channel can punch through the last portion of substrate separating it from source 12 due to high local field effects. Thus the transistor can turn on at a lower applied voltage. It should be noted that this enables one to tailor the turn-on voltage of the device to the needs of the circuit to which it is attached. Further, if the doping is not centrally located, the bidirectional characteristic of the device can be made asymmetrical.

Figure 2:
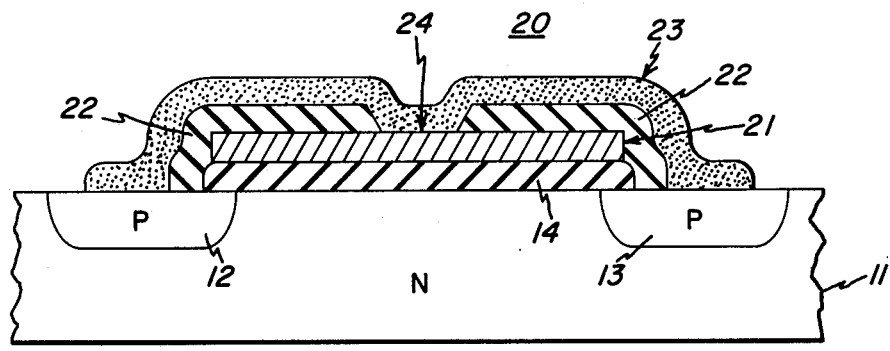
FIG. 2 illustrates a modification of the preferred embodiment of the present invention.

FIG. 2 illustrates a modification of the preferred embodiment of the present invention in which the resistive film is combined with a conductive gate wherein the conductive gate is attached to the resistive film at a predetermined point to apply a uniform fraction of the applied voltage to the channel region of the field effect transistor.

Specifically, field effect transistor 20 comprises a substrate 11 having source and drain regions 12 and 13 formed therein. Overlying the region between source 12 and drain 13 is insulating layer 14. Overlying insulating layer 14 and approximately coextensive therewith is conductive gate layer 21. Overlying conductive gate layer 21 and insulating it from all but a selected portion of the resistive film is insulating layer 22. Overlying insulating layer 22 is resistive film 23 in contact with both source 12 and drain 13. Insulating layer 22 has an aperture formed therein through which resistive film 23 makes contact with conductive gate layer 21 at a selected contact region 24.

The overall operation of field effect transistor 20 is similar to that of field effect transistor 10 except that in the characteristic curve illustrated in FIG. 3, what is known as the knee of the current vs. voltage characteristic curve is softer, that is, less curved, than for field effect transistor 10. This is due to the face that conductive gate layer 21 provides a uniform applied field across the channel region of field effect transistor 20.

Contact region 24 may be formed at any point along the overlap between resistive film 23 and conductive gate layer 21. By varying the point of contact one can selectively adjust the threshold voltage of the device since resistive film 23 and contact region 24 act as a potentiometer for supplying a selected fraction of the applied voltage to the conductive gate layer.

If contact region 24 is centrally located between source 12 and drain 13, then field effect transistor 20 retains the symmetrical properties described in connection with field effect transistor 10. If, however, contact area 24 is not centrally or symmetrically located, then, depending upon the direction of conduction through field effect transistor 20, a greater or lesser fraction of the applied voltage is coupled to conductive gate layer 21.

Field effect transistor 20 may be fabricated by any suitable means known in the art. Conductive gate layer 21 may comprise any suitable conductor, such as, but not limited to, silicon, aluminum, or molybdenum. If silicon is used for the conductive layer, then transistor 20 is readily fabricated in a series of deposition, oxidation, and diffusion processing steps.

There is thus provided by the present invention an integrated circuit protective element that limits voltage excursions in both directions of conduction therethrough. The field effect transistor in accordance with the present invention is readily fabricated on the same substrate as the protected element without entailing unusual or additional processing steps and without the turn-on voltage thereof being dependent upon other elements on the same substrate due to processing limitations.

Having thus described the present invention, it will be apparent to those of skill in the art that various modifications can be made in accordance with the spirit and scope of the present invention. For example, while a preferred embodiment has been illustrated as comprising a p-channel field effect transistor, obviously n-channel field effect transistors can also be used in implementing the present invention. The characteristics of the device may be modified in other ways, such as using tapered or stepped gate oxide thicknesses. Also the resistive gate may be of a meandering type with only one portion of its length over the active source-drain channel. The behavior of this device then approximates that of either the embodiment of FIG. 2 or the non-uniform resistivity gate modification discussed above.

Further, while the doping of the resistive layer has been described in connection with FIG. 1, this modification can also be made of the embodiment of FIG. 2 in either tailoring the threshold voltage to the needs of other circuitry or in providing asymmetrical bidirectional characteristics.

What we claim as new and desire to secure by Letters Patent of the U.S. is:

1. A constant voltage load comprising:
   a semiconductor substrate of a first conductivity type;
   first and second regions of an opposite conductivity type formed in said substrate;
   insulating means overlying the area on said substrate between said first and second regions;
   resistive gate means overlying said insulating means and in electrical contact with said first and second regions.

2. A constant voltage load as set forth in claim 1 wherein said resistive gate means comprises a layer of material selected from the group consisting of polycrystalline silicon and glasses consisting substantially of vanadium pentoxide.

3. A constant voltage load as set forth in claim 2 wherein said resistive layer comprises polycrystalline silicon.

4. A constant voltage load as set forth in claim 3 wherein said polycrystalline silicon has a doped, higher conductivity central portion.

5. A constant voltage load as set forth in claim 1 wherein said resistive gate means comprises:
   a conductive layer overlying a portion of said insulating means;
   a first resistive layer segment electrically connecting one end of said conductive layer to said first region; and
   a second resistive layer segment electrically connecting another end of said conductive layer to said second region.

6. A constant voltage load as set forth in claim 5 wherein said resistive gate means comprises a continuous layer of resistive material having a doped portion forming said conductive layer.

7. A constant voltage load as set forth in claim 6 wherein said resistive material comprises polycrystalline silicon.

8. A constant voltage load as set forth in claim 1 and further comprising:
   a conductive layer overlying said insulating means; and
   an insulating layer overlying and surrounding said conductive layer, said insulating layer having an aperture exposing a portion of said conductive layer; and wherein
   said resistive means electrically contacts said conductive layer through said aperture.

9. A constant voltage load as set forth in claim 8 wherein said aperture is approximately centrally located with respect to said region.

10. A constant voltage load as set forth in claim 9 wherein said resistive means has an approximately uniform resistivity from one of said regions to the other of said regions.

11. A constant voltage means as set forth in claim 9 wherein said resistive means has a non-uniform resistivity from one of said regions to the other of said regions.

12. A constant voltage load as set forth in claim 8 wherein said aperture is asymmetrically located with respect to said first and second regions.

* * * * *